(12) United States Patent
Swanson et al.

(10) Patent No.: US 6,331,785 B1
(45) Date of Patent: Dec. 18, 2001

(54) POLLING TO DETERMINE OPTIMAL IMPEDANCE

(75) Inventors: Eric J. Swanson, Buda; Diwakar Vishakhadatta, Austin, both of TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/641,479

(22) Filed: Aug. 18, 2000

(Under 37 CFR 1.47)

Related U.S. Application Data
(60) Provisional application No. 60/178,535, filed on Jan. 26, 2000.

(51) Int. Cl.[7] .................................................. H03K 17/14
(52) U.S. Cl. ................................................. 326/30; 326/82
(58) Field of Search ................................. 326/30, 21, 26, 326/82, 83, 86

(56) References Cited

U.S. PATENT DOCUMENTS

| | | |
|---|---|---|
| 4,349,788 | 9/1982 | Sondermeyer . |
| 4,593,252 | 6/1986 | Korn . |
| 4,675,861 * | 6/1987 | Uttermark ................................ 370/4 |
| 5,047,663 * | 9/1991 | Lee et al. ................................ 326/82 |
| 5,121,080 | 6/1992 | Scott, III et al. . |
| 5,128,962 * | 7/1992 | Kerslake et al. ........................ 345/7 |
| 5,204,636 | 4/1993 | Werner, Jr. et al. . |
| 5,229,720 | 7/1993 | Nishimura . |
| 5,477,190 | 12/1995 | Brehmer et al. . |
| 5,510,751 | 4/1996 | Nauta . |
| 5,585,763 | 12/1996 | Navabi et al. . |
| 5,736,900 | 4/1998 | Smith . |
| 5,754,066 | 5/1998 | Smith . |
| 5,999,619 | 12/1999 | Bingel . |
| 6,087,847 * | 7/2000 | Mooney et al. ........................ 326/30 |

OTHER PUBLICATIONS

"110–GB/s Simultaneous Bidirectional Transceiver Logic Synchronized with a System Clock," Toshio Takahaski, et al., IEEE Journal of Solid–State Circuits, vol. 34, No. 11, Nov. 1999 (8 pages).

* cited by examiner

Primary Examiner—Michael Tokar
Assistant Examiner—Don Phu Le
(74) Attorney, Agent, or Firm—Brian C. McCormack; Baker & Mckenzie; Steven Lin (57) ABSTRACT

A system and method is provided for providing optimal input and output impedances at a telecommunications interface. Input and output impedances can be adjusted manually, or the optimal impedance can be sensed and provided for automatically at the selected interface.

20 Claims, 4 Drawing Sheets

POLLING TO DETERMINE OPTIMAL IMPEDANCE

RELATED PATENTS AND APPLICATIONS

This patent application hereby claims priority from provisional patent application No. 60/178,535, filed Jan. 26, 2000. Other related patents and patent applications, which are hereby incorporated by reference herein, include:

| U.S. Pat. No. | Filing Date |
| --- | --- |
| 5,121,080 | December 20, 1990 |
| 5,585,763 | March 30, 1995 |

TECHNICAL FIELD

This embodiments described in this document relate to provision of a generalized interface for signals to be carried on selected communication carriers, and compensation, manually or otherwise, for different impedance levels associated with each of these signal carriers.

BACKGROUND

Many network users regularly transmit and/or receive messages over T1 carriers in the U.S. and Canada (1.544 Mbits/sec rate; required line impedance of 100 Ohms), over E1 carriers in Europe (2.048 Mbits/sec rate; required impedances of 75 Ohms or 120 Ohms), and over J1 carriers in Japan (1.544 Mbits/sec rate; required impedance of 100 Ohms). Presently, transmission and receipt of digital signals on a T1 line and on an E1 carrier, for example, require use of separate chips to compensate for different required impedances, different framing patterns, different bit rates and such. In the future, Digital Subscriber Lines (DSLs) will transmit digital signals at selected rates, such as Tn and En and Jn rates (n=1, 1C, 2, 3, 4, 4M . . . ), and will become important for heavy duty information transfer, such as multicast communication for various Internet Protocol ("IP") applications (voice band telephone, picturephone, combined voice-over-data transfer, video-on-demand, etc.).

SUMMARY

Embodiments described below provide for transmission and/or reception of signals over Tn and En and Jn signal carriers will also require matching of corresponding, and different, impedances for use of these signal carriers. The embodiments further provide for an interface system that determines and provides an optimal input and output impedance required or desired to properly match the network communication carrier. Preferably, for a given impedance value, the interface provides an impedance match whether the signal for transmission or reception is conventional or arises from line reflections produced downstream and received at an input or output terminal of the interface. The system provides an optimal input or output impedance or a chosen impedance for a given signal line. The described embodiments provide a signal amplifier system and interface having a mechanism for testing for and selecting an optimal input impedance and output impedance (referred to collectively herein as a "selected impedance"), depending upon the requirements of the line that will receive and propagate the outgoing signal. One such range is 75–120 ohms, which covers particular T1, E1, and J1 carrier line impedances. This range can be extended to cover desired or required impedances that lie outside this range, if desired. In one embodiment, the signal amplifier system uses a differential amplifier with feedback conductances chosen to match the target line impedance for signal transmission. Another embodiment enhances the ability of the signal amplifier system to compensate for signals received from unanticipated signal sources, such as line reflections.

Described in this specification are signal transmit/receive systems that test for and provide correct selected impedances for signals transmitted by the system on a selected signal carrier. In one embodiment, the system includes a signal interface circuit, with at least one signal input terminal and at least one signal output terminal, that has at least one adjustable circuit parameter that can be used to vary an equivalent selected impedance for the interface circuit. The system also includes an impedance adjustment mechanism, connected to the interface circuit, that provides and implements a choice between two or more values for the at least one adjustable circuit parameter that varies the selected impedance for the interface circuit.

The system includes an impedance testing sub-system that tests the signal carrier chosen or used, determines the optimal present impedance for that line, and adjusts one or more circuit parameters to provide this optimal selected impedance. The system, in another embodiment, allows choice of one or more default impedance parameters as an alternative to use of an optimal value for one or more parameters.

DETAILED DESCRIPTION OF THE EMBODIMENTS

Figure 1A:
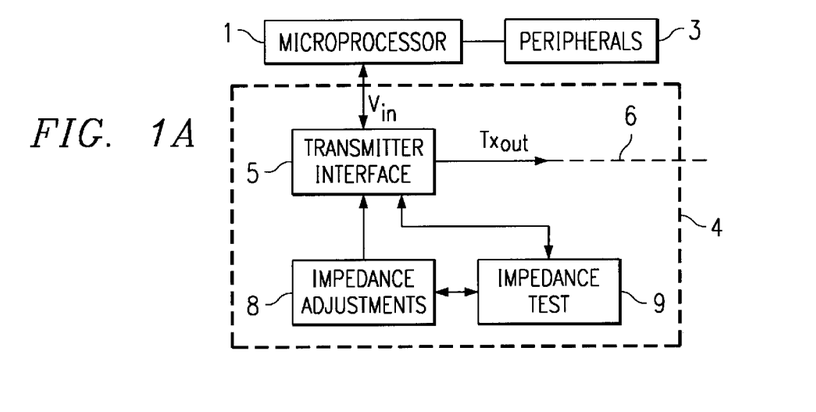
FIGS. 1A, 1B, 1C and 1D provide several embodiments which are described in the application.

FIG. 1A illustrates an embodiment in which a microprocessor or other signal source 1, with associated peripherals 3, provides a signal $V_{in}$ that is to be transmitted through a transceiver 4, including a transmitter output impedance control interface 5 to transmit an output signal $V_{out}$ to one or more signal recipients on an output signal line 6. A timer signal line 7 provides a timing signal for at least one of the microprocessor 1 and the interface 5.

The output signals may be transmitted to a signal recipient using a T1 signal carrier, as used in the United States using an E1 carrier, as in Europe and parts of South America, or using a Jn carrier, as in Japan. More generally, a Tn or En or Jn signal carrier may be used to provide greater bandwidth, a higher information transfer rate or a greater signal propagation distance. An impedance adjustments module 8 allows adjustment of the values of one or more internal impedance or conductance parameters to correspond to the signal carrier that is to be used. The impedance adjustments module 8 may be manually operated, where the user or maintainer determines and enters, through a keyboard or light pen or other data entry device associated with the module 8, the required or desired output impedance, based on the signal carrier that will be used. Alternatively, the impedance adjustments module 8 may be semiautomatic or fully automatic, using an impedance test module 9 that is discussed in the following. In this alternative, the system senses the signal carrier to be used, consults an on-board database, and implements one or more interface circuit adjustments that will provide the desired output impedance.

Ideally, a T1 or J1 signal carrier requires a 100 ohm output impedance, whereas an E1 signal carrier requires either 75 ohms or 120 ohms. Because a particular piece of network equipment may be shipped to a plurality of destinations, it may not be known in advance the optimal impedance of the network on which the network equipment will operate. Preferably, the interface 5 determines that a specified output impedance is optimal and adjusts the circuits to produce this impedance, no matter what input signal is provided and no matter the condition of the signal line 9.

Figure 1B:
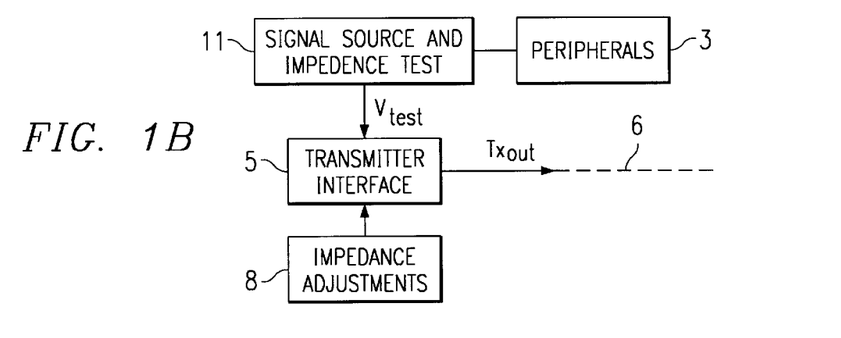

FIG. 1B illustrates a different environment, in which a combined signal source and impedance test module 11, with optional associated peripherals 3, provides a test signal $V_{test}$ to be transmitted through a transmitter output impedance control interface 5, as an output signal $Tx_{out}$, to one or more real or virtual signal recipients on a signal line $Tx_{out}$ 6. Again, the signals may be transmitted using a Tn carrier, an En carrier or a Jn carrier. Also, the impedance adjustments module 8 may again be manually operated, where the maintainer determines and enters, through a keyboard or light pen or other data entry device associated with the module 8, the required or desired output impedance, based on the signal transmission protocol that will be used. Alternatively, the impedance adjustments module 8 may be semiautomatic or fully automatic, using an impedance test module 9 that is discussed in the following. In this alternative, the system senses the signal carrier to be used, consults an on-board database, and implements one or more interface circuit adjustments that will provide the required or desired output impedance.

Figure 1C:
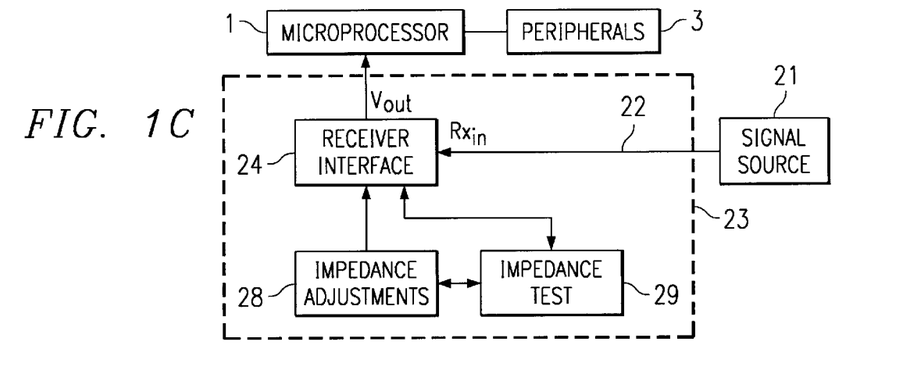

FIG. 1C illustrates another embodiment. A signal source 21 transmits a signal $Rx_{in}$ that is received on an input signal line 22 by a receiver 23 that includes a receiver input impedance control interface 24. Optionally, the receiver interface 24 receives the $Rx_{in}$ signal 22 and outputs a $V_{out}$ signal to signal $V_{in}$ a microprocessor 1, with optional associated peripherals 3, for processing and/or storage. Again, the signals may be transmitted using a Tn carrier, an En carrier or a Jn carrier. As above, the impedance adjustments module 28 may be manually operated, where the maintainer determines and enters, through a keyboard or light pen or other data entry device associated with the module 28, the required or desired output impedance, based on the signal carrier that will be used. Alternatively, the input impedance can be automatically determined and implemented, using an impedance adjustment module 28 and an impedance test module 29.

Figure 1D:
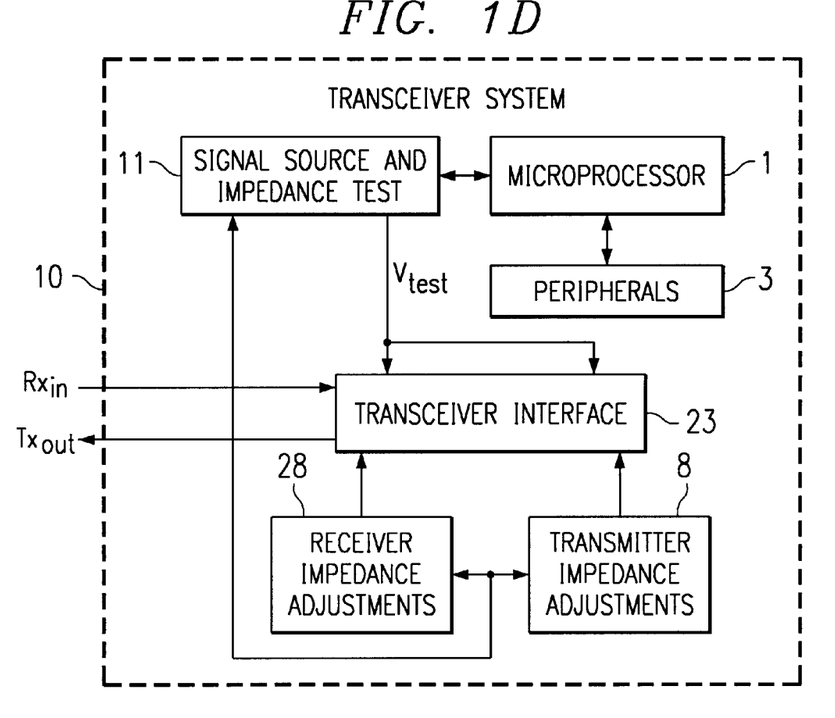

FIG. 1D illustrates a transceiver configured to operate with the described embodiments. The transceiver 10 includes a signal source and impedance tester 11, a microprocessor 1 and peripherals 3 (optional), a transceiver interface 23, a transmitter impedance adjustments module 8, a signal source 21, and a receiver impedance adjustments module 28, connected to each other as shown. The transceiver is preferably a single device which integrates the impedance adjustments modules 8, 28 with the transceiver interface 23. The impedance adjustment modules preferably automatically adjust the impedances of the transmitters and receivers of the transceiver interface 23 according to the signal carriers attached at $Rx_{in}$ and $Tx_{out}$ to the transceiver system 10.

Table 1 presents the signal line rates and physical media normally used for several Tn and En and Jn signal carriers.

TABLE 1

Signal Rates and Media Used For Particular Carrier Systems

| Signal carrier | Bit Rate | Medium used |
|---|---|---|
| T1 | 1.544 | UTP wire |
| T-1C | 3.152 | shielded wire |
| T2 | 6.312 | TP cable |
| T3 | 44.736 | - wave or optical fiber |
| T-3C | 89.472 | " |
| T4 | 174.176 | " |
| T-4M | 258.048 | " |
| E1 | 2.048 | UTP/coax |
| E2 | 8.448 | UTP/coax |
| E3 | 34.368 | optical fiber |
| E4 | 139.264 | " |
| E5 | 565.148 | " |
| E6 | 2,200.00 | " |
| J1 | 1.544 | UTP |
| J2 | 6.312 | shielded wire |
| J3 | 32.064 | optical fiber |
| J4 | 97.728 | " |
| J5 | 397.2 | " |

Figure 2:
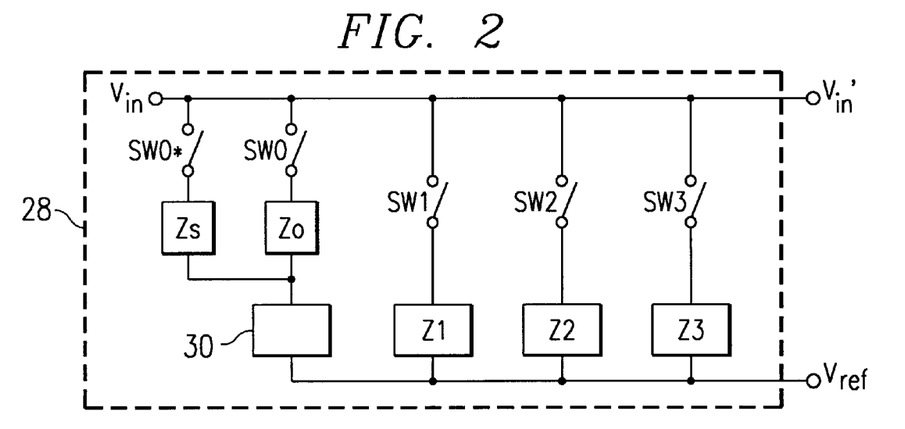
FIG. 2 is a schematic view of an adjustable impedance apparatus which can be used in the embodiments of FIGS. 1A–1D.

FIG. 2 illustrates, in principle, an impedance matching circuit. A signal source or signal sink 30 has an associated impedance Z0 with a relatively high magnitude and a switch SW0 (normally closed), and is also provided: with a first impedance Z1 in series with a first switch SW1; with a second impedance Z2 in series with a second switch SW2; and with a third impedance Z3 in series with a third switch SW3, each in parallel with the impedance Z0. When the switches SW1, SW2 and SW3 are all open, the associated impedance is Z0. When the switch SWi(i=0, 1, 2, 3) is closed and the other switches are open, the associated impedance is Z=Zi.

When two or more of the switches SW0, SW1, SW2 and SW3 are closed, the associated impedance is $$Z = \frac{Z0gZ1gZ2gZ3}{\varepsilon 0gZ1gZ2gZ3 + \varepsilon 1gZ0gZ2gZ3 + \varepsilon 2gZ0gZ1gZ3 + \varepsilon 3gZ0gZ1gZ2}, \quad (1.1)$$

or, expressed differently, $$\frac{1}{Z} = \frac{\varepsilon 0}{Z0} + \frac{\varepsilon 1}{Z1} + \frac{\varepsilon 2}{Z2} + \frac{\varepsilon 3}{Z3}, \quad (1.2)$$

where $$Ei = \left\{\frac{1, \text{ if } SWi \text{ is closed}}{0, \text{ if } SWi \text{ is open}}\right\}, (i = 0, 1, 2, 3). \quad (1.3)$$

As many as sixteen different impedance values can be generated by choices of the four indices E0, E1, E2 and E3.

Optionally, the signal source or sink 30 may be provided with a shunt impedance Zs and with a switch SW0*. The switch SW0* is open when the switch SW0 is closed and is closed when the switch SW0 is open. When all switches SW0, SW1, SW2 and SW3 are open (E0=E1=E2=E3=0) and switch SW0* is closed, the signal source or sink 30 has an associated impedance of Zs, which can be manually chosen by the maintainer or can be provided as a fixed default value. In a balanced signal approach, the above switch/resistor combination is preferably implemented by splitting the resistance and physically placing half the resistance on either side of the switch, which is preferably a MOSFET switch. Thus, one half the resistance is interposed between either side of the MOSFET switch and the respective half of the circuit path.

Figure 3:
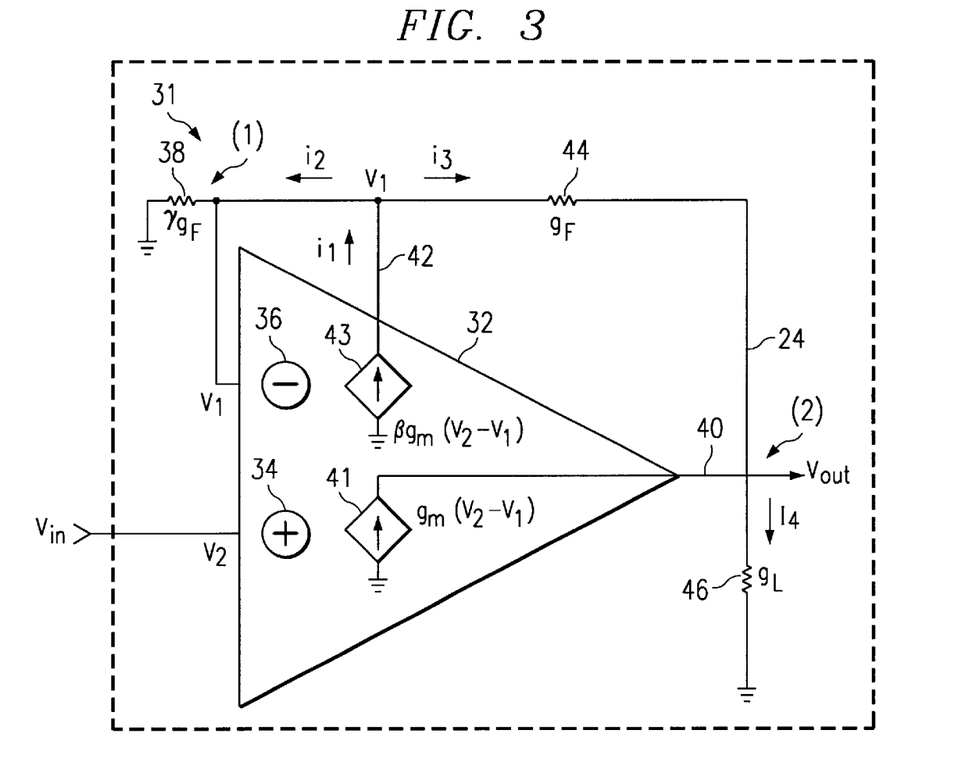
FIGS. 3 and 4 are schematic views of a controlled impedance output amplifier which can be used with the embodiments of FIGS. 1A–1D.

FIG. 3 is a schematic view of a non-inverting input amplifier circuit 31, disclosed in U.S. Pat. No. 5,121,080, incorporated by reference herein, that can be used to help provide controllable output impedance. A non-inverting input terminal 34 of an amplifier 32 receives an input signal voltage $V_2=V_{in}$ that is to be transmitted. An inverting input terminal 36 is connected to ground across a first conductance module 38 that provides a selected electrical conductance value $\gamma g_F$, where $\gamma$ is a selected non-negative fraction, and receives an intermediate input signal voltage $V_1$ from a first output terminal 40 of the amplifier 32 across a second conductance module 44 that provides a selected conductance value $g_F$. The inverting input terminal 36 of the amplifier 32 is also connected to a second output terminal 42. The first output terminal 40 of the amplifier 32 has an associated electrical load 46, represented by a conductance $g_L$. If Kirchoff's current rule is applied at the nodes (1) and (2), the intermediate voltage $V_1$ and the output terminal voltage $V_0$ can be expressed in terms of the input signal voltage $V_{in}$ in the FIG. 3 apparatus as:

$$\begin{pmatrix} V_1 \\ V_0 \end{pmatrix} = \begin{pmatrix} (g_F+g_L) & -(g_F-g_m) \\ -g_F & (1+\gamma)g_F+\beta g_m \end{pmatrix} \begin{pmatrix} \beta g_m V_{in}/\Delta 1 \\ g_m V_{in}/\Delta 1 \end{pmatrix}, \quad (1.4)$$

where $$\Delta 1 = ((1+\gamma)g_F + \beta g_m)(g_F+g_L) - g_F(g_F-g_m). \quad (1.5)$$

The beta value for the feedback circuit in FIG. 3 is approximately $$\beta(f) \approx \gamma/(1+\gamma). \quad (1.6)$$

The input impedance associated with the FIG. 3 apparatus is approximately $$Z(in) \approx (1+A\beta(f)) r_{in}, \quad (1.7)$$

where A is the open loop gain of the amplifier and $r_{in}$ is a characteristic input resistance that exists between the two input terminals. Typically, $r_{in}$ 0.3–2 Mohms. The output impedance associated with the apparatus in FIG. 3 is approximately $$Z(out) = \frac{r_{out}}{1+A\beta(f)} \quad (1.8)$$

where A is the open loop gain of the amplifier and $r_{out}$ is a characteristic internal output resistance that exists at the output terminal. Typically, $r_{out}$ is approximately 75 Ohms. By an appropriate choice of the conductance parameter $\gamma$, the output impedance at the output terminal 40 (or, alternatively, the input impedance at the input terminal 34) can be varied to match whatever carrier line impedance is found to be present. Internal sources 41 and 43 provide differential currents of $g_m(V_2-V_1)$ and $\beta g_m(V_2-V_1)$ at the respective first output terminal 40 and second output terminal 42, where $\beta$ (gain) and $g_m$ (conductance) are selected parameters.

Figure 4:
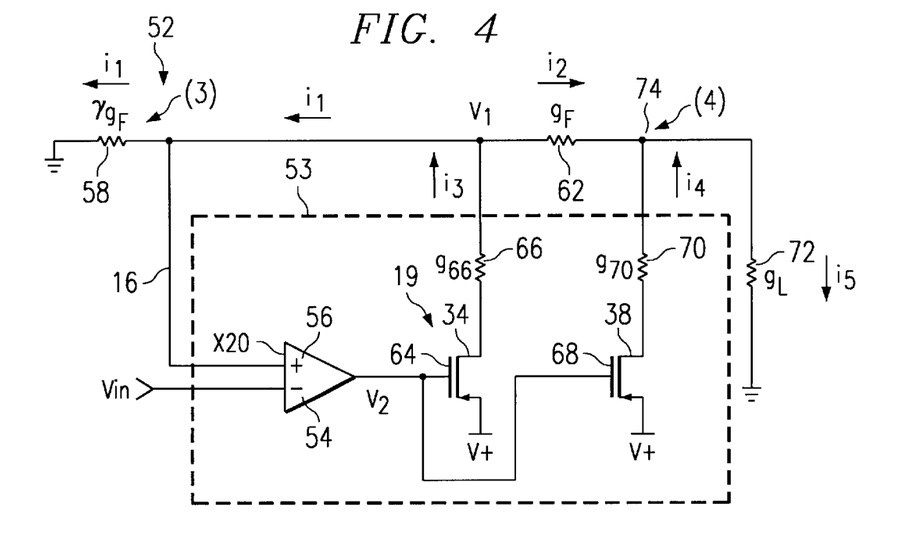

FIG. 4 is a schematic view of an inverting output amplifier system 52, also disclosed in U.S. Pat. No. 5,121,080, that provides controllable output impedance. An input signal $V_{in}$ is received at an inverting input terminal 54 of an amplifier gain block 53 (corresponding to the amplifier 32 in FIG. 2), and a non-inverting input terminal 56 receives a feedback input signal $V_1$ which is also connected to ground across a conductance module 58 with associated conductance value $\gamma g_F$. The amplifier gain block 53 produces, at an output terminal 60, an output signal that drives the gates of first and second p-channel MOS transistors 64 and 68. The source terminal of each transistor, 64 and 68, is connected to a common voltage source having a selected positive voltage $V_+$. A signal at the drain terminal 34 of the first transistor 64 is passed across a conductance module 66, with associated conductance value $g_{66}$, and contributes to the feedback current $I_F$ associated with the feedback input signal $V_1$. A signal at the drain terminal 38 of the second transistor 68 is passed across a conductance module 70 with associated conductance value $g_{70}$ to the output terminal 72 of the system 52, is also passed across a conductance module 62, having an associated conductance value $g_F$, and contributes to the feedback current of the feedback input signal $V_1$. The conductances $g_{66}$ and $g_{70}$ take account of the internal impedances of the transistors 66 and 70 and may also include the effects of discrete impedances included in these lines. The output terminal 72 of the system 52 has an associated electrical load 74, represented by a conductance $g_L$.

The system 52 shown in FIG. 4 has an output impedance that depends upon a current ratio $I_{in}/I_{out}$ and upon the conductance values, $g_F$ and $g_{66}$, of the feedback resistor modules 62 and 66. The system 52 will provide approximately constant output impedance for an input signal $V_{in}$ received at the inverting first input terminal. In order to match the anticipated line impedance(s) encountered at the output terminal in FIG. 4, a selected conductance value $g_F$ should be used that corresponds to the required or desired output impedance. Thus, for example, one conductance value $g_F$ may be used to provide a required output impedance for a Tn carrier or a Jn carrier (e.g., 100 Ohms for n=1), and another conductance value $g_F$ may be used to provide a required output impedance for an En carrier (e.g., 75 or 120 Ohms for n=1).

If Kirchoff's current rule is applied at the nodes (3) and (4), the intermediate voltage $V_1$ and the output terminal voltage $V_0$ in the FIG. 4 apparatus can be expressed in terms of the input signal voltage $V_{in}$ as $$\begin{pmatrix} V_1 \\ V_0 \end{pmatrix} = \begin{pmatrix} g_F+g_L+g_{70} & -g_F \\ -g_F & (1+\gamma)g_F+g_{66} \end{pmatrix} \begin{pmatrix} g_{66} V_{in}/\Delta 2 \\ g_{70} V_{in}/\Delta 2 \end{pmatrix}, \quad (1.9)$$

where $$\Delta 2 = (g_F+g_L+g_{70})((1+\gamma)g_F+g_{66}) - (g_F)^2, \quad (1.10)$$

if the two transistors 64 and 68 are turned fully on $(V_0=A(V_1-V_{in}) V_{on})$. If the two transistors are turned fully off $(V_0=A(V_1-V_{in}) V_{off})$, the voltages $V_1$ and $V_0$ are determined using equations (1.9) and (1.10) and setting $g_{66}=g_{70}=0$.

The beta value for the feedback circuit in FIG. 3 is approximately $$\beta(f) \approx \gamma/(1+\gamma). \quad (1.11)$$

The input impedance associated with the FIG. 3 apparatus is approximately $$Z(in) \approx (1+A\beta(f))r_{in}, \qquad (1.12)$$

where A is the open loop gain of the amplifier and $r_{in}$ is a characteristic input resistance that exists between the two input terminals. Typically, $r_{in}$ 0.3–2 Mohms. The output impedance associated with the apparatus in FIG. 3 is approximately $$Z(out) \approx \frac{r_{out}}{(1+A\beta(f))} \qquad (1.13)$$

if the two transistors 64 and 68 are turned fully on ($V_0 = A(V_1 - V_{in}) V_{on}$). If the two transistors 64 and 68 are turned fully off ($V_0 = A(V_1 - V_{in}) V_{off}$), the voltages $V_1$ and $V_0$ are determined using Equations (1.9) and (1.10) and formally setting $g_{66}=g_{70}=0$.

The beta value for the feedback circuit in FIG. 4 is approximately $$\beta(f) \approx \gamma/(1+\gamma) \qquad (1.14)$$

The input impedance associated with the apparatus in FIG. 3 is approximately $$Z(in) \approx (1+A\beta(f))r_{in}, \qquad (1.15)$$

where A is the open loop gain of the amplifier and rin is a characteristic input resistance that exists between the two input terminals. The output impedance associated with the apparatus in FIG. 3 is approximately $$Z(out) \approx \frac{r_{out}}{1+A\beta(f)}, \qquad (1.16)$$

where A is the open loop gain of the amplifier and rout is a characteristic internal output resistance that exists at the output terminal. By an appropriate choice of the conductance parameter γ, the output impedance at the output terminal 74 (or, alternatively, the input impedance at the input terminal 54) can be varied to match whatever carrier line impedance is found to be present.

By an appropriate choice of the conductance value $g_F$, the output impedance at the terminal 74 (or, alternatively, the input impedance at the terminal 54) can be varied to match whatever carrier line impedance is found to be present.

As noted in U.S. Pat. No. 5,585,763, incorporated by reference herein, the system 52 may not provide approximately constant output impedance for a reflected signal received (viewed as an equivalent input signal) at the output terminal 72 in FIG. 4.

Another system 300, illustrated in FIG. 4 of U.S. Pat. No. 5,585,763 and reproduced as FIG. 5 in this disclosure, appears to provide an approximately constant output impedance for any (equivalent) input signal appearing at the input terminal 325 or as a reflected signal at the output terminal 360. The discussion of the system 300 at columns 2–6 of U.S. Pat. No. 5,585,763 is incorporated by reference herein. The system 300 in FIG. 5 herein includes a first difference amplifier 310, having a non-inverting first input terminal 325, connected to ground across a selected current source 330 that provides a selected input current $I_n$.

Figure 5:
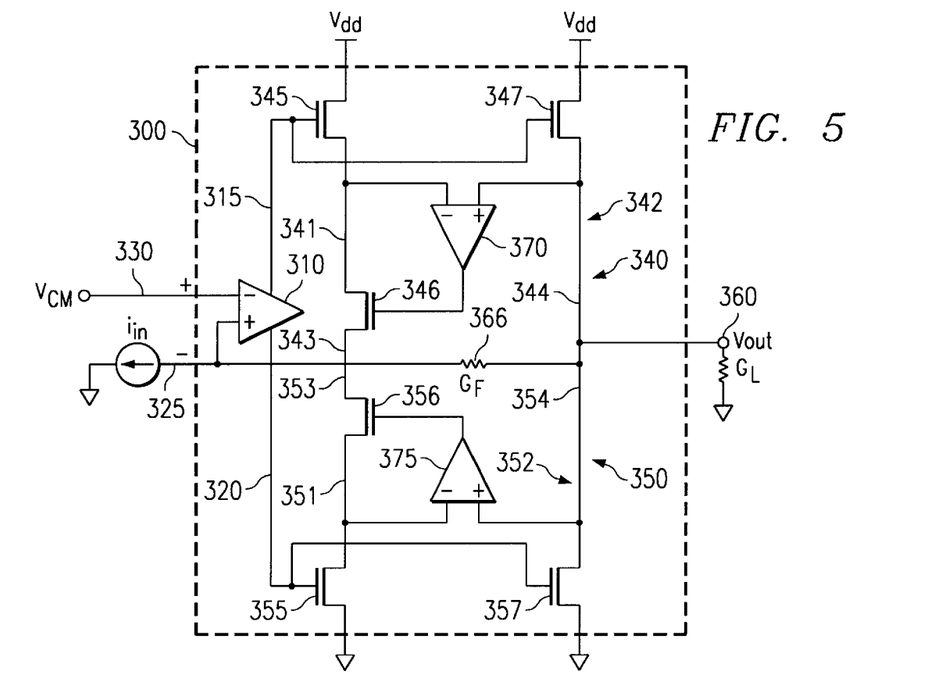
FIG. 5 is a schematic view of an alternative controlled impedance output amplifier system which can be used with the embodiments of FIGS. 1A–1D.

The first difference amplifier 310 has a first output terminal 315 that is connected to the gate of each of a first p-channel MOS transistor 345 and a second p-channel MOS transistor 347. The first difference amplifier 310 has a second output terminal 320 that is connected to connected to the gate of each of a first n-channel MOS transistor 355 and a second n-channel MOS transistor 357. The source terminals of the first and second p-channel transistors 345 and 347 are connected to a source 344 of a selected voltage Vdd. The source terminals of the first and second n-channel transistors 355 and 357 are connected to ground.

The drain terminal of the first p-channel transistor 345 is connected to the source terminal of a third p-channel transistor 346 and to an inverting input terminal of a second difference amplifier 370, whose output signal is connected to the gate of the third p-channel transistor 346. The drain terminal of the first n-channel transistor 355 is connected to the source terminal of a third n-channel transistor 356 and to an inverting input terminal of a third difference amplifier 375, whose output terminal is connected to the gate of the third n-channel transistor 356. The drain terminal of the second p-channel transistor 347 and of the second n-channel transistor 357 are connected to a non-inverting input terminal of the second difference amplifier 370 and to a non-inverting input terminal of the third difference amplifier, respectively. The drain terminals of the second p-channel transistor 347 and of the second n-channel transistor 357 are also connected to an output terminal 360 of the system 300. The output terminal 360 is connected to the input current source 325 across a conductance module 366 having a conductance value $g_F$ and across a load conductance module having a load conductance value $g_L$.

Optionally, a maintainer may use a manual impedance adjustment system 8, as shown in FIG. 1A, (or the signal source and impedance adjustment module 17 in FIG. 1B, or the impedance adjustment module 28 in FIG. 1C or 1D) to adjust one or more conductance values, γ, $g_F$, $g_m$, $g_{66}$, $g_{70}$, etc., of the system shown in FIG. 3, 4 or 5 to provide system impedances that match the impedance of the signal carrier system interfaced with.

The impedance adjustments module 8 in FIG. 1A, 1B or 1C and the impedance adjustment module 28 shown in FIG. 1C or 1D and the interfaces 5,23,24 may be arranged to work together to automatically, or semi-automatically, determine the appropriate impedances to match the signal carrier system, without requiring initial specification of the output signal parameters. In this alternative, an impedance test module 9, connected to the interface 5 and/or to the impedance adjustment module 8, selects and implements a test output impedance Z(test) in the interface 5 and transmits an output signal having a selected signal amplitude S0. Assuming, as is likely, that the test output impedance value is not the correct value, the system output terminal will receive a return signal at the interface output terminal whose amplitude is R·S0, where R is a real or complex line reflection coefficient that satisfies $0 \leq |R| < 1$ in the simplest case. The optimal output impedance Z(out) for the signal carrier may be estimated using the relation $$Z(out) = \frac{1-R}{1+R} gZ(test). \qquad (1.17)$$

This allows the required, optimal or desired signal carrier impedance to be automatically and quickly determined, and the impedance adjustments module 8 or 28 can then make the appropriate circuit parameter adjustments to provide the correct impedance.

Another method of determining the present value of the line impedance drives a selected non-zero current with the chosen carrier frequency onto the line and measures the resulting line voltage before a return signal is received on the line. The ratio of voltage divided by current provides an estimate of the present value of line impedance. Other methods of determining an optimal or correct output impedance may also be used here. These methods may be used to determine output line impedance and/or input line impedance.

The (approximately correct) system output impedance Z(out) in Equation (1.8), required or desired for output signal line impedance matching, may depend upon the predominant signal frequency used and may vary with time, depending upon line condition and other parameters. As another alternative, the signal line may be queried for a short time interval from time to time, using a method discussed in the preceding paragraph or another method, to determine the impedance value presently required to optimally match the signal output line in the line's present condition. During this line query period, preferably no other signal is transmitted or received at the system terminal. This line query time interval might require presence of a quiescent time interval, such as 0.001–0.5 seconds, and might be imposed once every 1–180 seconds, to provide an adequate estimate of the output impedance presently required for signal carrier output impedance matching.

Figure 6:
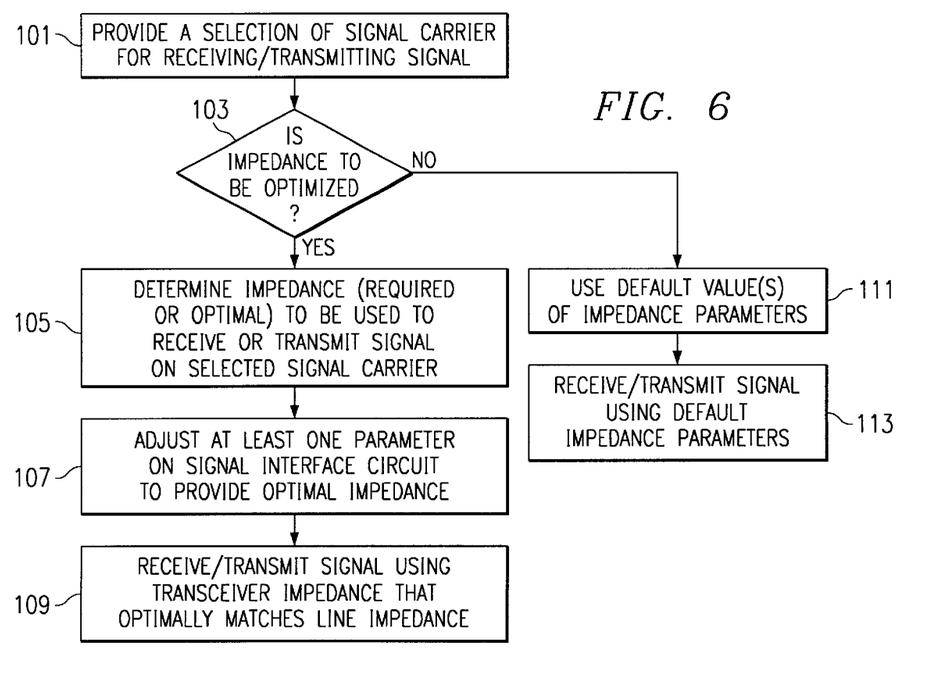
FIG. 6 is a flow chart illustrating methods for implementing the embodiments described in this patent application.

FIG. 6 is a flow chart illustrating a method for implementing the impedance matching approach. In step 101, a maintainer (or the system) selects a signal carrier for receiving or transmitting a signal. In step 103, the system inquires if the (output or input) impedance is to be optimized?

If the answer to the question in step 103 is "yes," the system moves to step 105, provides a test signal, analyzes a signal received in response to the test signal, and determines the required or optimal impedance to be used with the selected signal carrier. This could be done manually or automatically, as discussed above. In step 107, the system adjusts at least one parameter associated with the signal interface circuit to provide the desired impedance for the selected signal carrier. In step 109 (optional), the maintainer or system transmits or receives a signal on a line after optimally matching the transmitter, receiver or transceiver impedance to the line impedance.

If the answer to the question in step 103 is "no," the system uses default or other selected values for the adjustable impedance parameters in step 111, and receives or transmits a signal on a line using the default values) of the (output or input) impedance.

The scope of what can be claimed is not limited to provision of a correct output impedance for a Tn or En or Jn carrier. The approach described can be applied to any signal line for which the important operating parameters, including maximum signal rate and required or desired output impedance(s), are known and more-or-less fixed. Ideally, the impedance adjustments module 8 in FIG. 1A, and/or FIG. 1B or 1D and/or 28 in FIG. 1C or 1D will include a microprocessor, a data entry device and a resident database that specifies one or more required output impedances for each of several signal lines that are likely to be used by the system. If an impedance test module 9 (FIG. 1A), 11 (FIG. 1B or 1D) or 29 (FIG. 1C) is also available, to provide automatic or semi-automatic measurement of a required output or input impedance, based on the signal carrier chosen and present line conditions, the resident database may be located at the impedance test module. In this latter instance, the impedance test module optionally includes a timer that tests each of one or more signal lines at selected time intervals (e.g., once every 1–180 seconds) and automatically adjusts the output impedance for each signal line tested, based on present line conditions.

The impedance matching action of the apparatus in FIG. 3 may be disabled, thereby converting this apparatus to one that does not compensate for varying output impedance, by setting $g_F$ equal to 0, equivalent to opening the circuit line at each of the conductances 38 and 44.

The impedance matching action of the apparatuses in FIGS. 4–5 may be disabled, thereby converting this apparatus to one that does not compensate for varying output impedance, by setting $g_F$ equal to 0, equivalent to opening the circuit line at each of the conductances 58 and 62.

A few preferred embodiments have been described in detail hereinabove. It is to be understood that the scope of the invention also comprehends embodiments different from those described, yet within the scope of the claims. While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments. Particular embodiments of this invention can be carried out in software, firmware, or hardware.

What is claimed is:

1. A signal interface circuit for receiving a first communication signal on a first communication line and for transmitting a second communication signal on a second communication line, said signal interface circuit comprising:

(a) an input for receiving said first communication signal from said first communication line;

(b) an output for transmitting said second communication signal upon said second communication line;

(c) a first impedance adjustment circuit connected to said input and operable to adjust the impedance of said input as it appears to said first communication line;

(d) a second impedance adjustment circuit connected to said output and operable to adjust the impedance of said output as it appears to said second communication line; and (e) a control circuit connected to said first and second impedance adjustment circuits.

2. The signal interface circuit of claim 1 wherein said first impedance adjustment circuit, said second impedance adjustment circuit, and said control circuit are comprised within a single integrated circuit device.

3. The signal interface circuit of claim 1 wherein said control circuit adjusts the impedance of at least one of said first impedance adjustment circuit and said second impedance adjustment circuit in response to the external commands of a system maintainer.

4. The signal interface circuit of claim 1 and further comprising an impedance test circuit connected to at least one of said input and said output.

5. The signal interface circuit of claim 4 wherein said impedance test circuit is further connected to said control circuit.

6. The signal interface circuit of claim 5 wherein said control circuit provides test results from said impedance test circuit to a system maintainer.

7. The signal interface circuit of claim 5 wherein said control circuit is operable to adjust at least one of said first and second impedance adjustment circuits based on test results provided by said impedance test circuit.

8. The signal interface circuit of claim 7 wherein said adjustment is done by said control circuit automatically based on said test results.

9. The signal interface circuit of claim 1 wherein at least one of said impedance adjustment circuits can adjust the impedance of its respective input/output to one of at least three different impedances.

10. The signal interface circuit of claim 1 wherein said control circuit is operable to adjust the impedances of said first and second impedance adjustment circuits such that the same impedance appears from the signal interface circuit to both of said first and second communication lines.

11. The signal interface circuit of claim 1 wherein said first and second impedance adjustment circuits operate in tandem such that the impedances of said input and output are adjusted to appear as the same value to both said first and second communication lines.

12. The signal interface circuit of claim 4 wherein said test circuit operates to transmit a test signal and receive a return signal whereby the signal interface circuit can analyze said return signal and determine a preferred impedance value for the interface circuit at the selected terminal through which said test signal and said return signal were transmitted and received.

13. The signal interface circuit of claim 4 and further comprising a timer that communicates with said test circuit to provide a selected test activation signal at least once in a time interval of a selected length, upon the receipt of which the test circuit transmits said test signal at the selected terminal through which said test signal and said return signal were transmitted and received.

14. The signal interface circuit of claim 1 wherein at least one of said first and second impedance adjustment circuits is an operational amplifier circuit.

15. A monolithic integrated signal interface circuit for receiving a first communication signal on a first communication line and for transmitting a second communication signal on a second communication line, said signal interface circuit comprising:

(a) an input for receiving said first communication signal from said first communication line;

(b) an output for transmitting said second communication signal upon said second communication line;

(c) an impedance adjustment circuit connected to said input and said output, said impedance adjustment circuit operable to adjust the impedances of said input and said output as they appear to said input and said output;

(d) a control circuit connected to said impedance adjustment circuit and operable through said impedance adjustment circuit to independently adjust the impedances of said input and said output.

16. The signal interface of claim 15 wherein said control circuit adjusts the impedance of said first impedance adjustment circuit and said second impedance adjustment circuit in response to the external commands of a system maintainer.

17. A method for adjusting the impedance of at least one of signal input and signal output of a signal interface circuit having a signal output terminal, a signal input terminal, an impedance adjustment circuit, a control circuit, and an impedance test circuit, the method comprising:

(a) transmitting by said impedance test circuit a test signal from said at least one said signal input terminal and said signal output terminal;

(b) receiving by said test circuit at said input/output a return signal which is the reflection of said test signal;

(c) adjusting the impedance of said at least one of said signal input terminal and said signal output terminal.

18. The method of claim 17 wherein said test signal is provided at least once during a time interval of a selected length.

19. The method of claim 17 and further comprising monitoring said at least one of said signal input terminal and said signal output terminal and receiving said test signal when no other signal is present.

20. The method of claim 17 and further comprising providing a known impedance value for use during testing such that the transmission of said test signal and the reception of said return signal occurs at said signal input terminal and said signal output terminal with known circuit conditions.

* * * * *